United States Patent
de Vries et al.

(10) Patent No.: US 10,454,409 B2
(45) Date of Patent: Oct. 22, 2019

(54) NON-FLAT SOLAR ROOF TILES

(71) Applicant: TESLA, INC., Palo Alto, CA (US)

(72) Inventors: Nicholas G. J. de Vries, Alameda, CA (US); Bobby Yang, Dublin, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/887,913

(22) Filed: Feb. 2, 2018

(65) Prior Publication Data

US 2019/0245478 A1   Aug. 8, 2019

(51) Int. Cl.
| | |
|---|---|
| *H02S 20/25* | (2014.01) |
| *H01L 31/048* | (2014.01) |
| *H01L 31/05* | (2014.01) |
| *H01L 31/049* | (2014.01) |
| *H02S 40/36* | (2014.01) |

(52) U.S. Cl.
CPC ............ *H02S 20/25* (2014.12); *H01L 31/049* (2014.12); *H01L 31/0488* (2013.01); *H01L 31/0504* (2013.01); *H02S 40/36* (2014.12)

(58) Field of Classification Search
CPC ........... H02S 20/22; H02S 20/23; H02S 20/25
See application file for complete search history.

(56) References Cited

U.S. PATENT DOCUMENTS

| | | |
|---|---|---|
| 3,369,939 A | 2/1968 | Myer |
| 3,461,602 A | 8/1969 | Heinz |
| 4,239,810 A | 12/1980 | Alameddine |
| 4,724,011 A | 2/1988 | Turner |
| 5,118,540 A | 6/1992 | Hutchison |
| 5,338,369 A | 8/1994 | Rawlings |
| 5,427,961 A | 6/1995 | Takenouchi |
| 5,667,596 A | 9/1997 | Tsuzuki |
| 5,942,048 A | 8/1999 | Fujisaki |
| 6,133,522 A | 10/2000 | Kataoka |
| 6,311,436 B1 * | 11/2001 | Mimura .................. E04D 1/365 136/251 |

(Continued)

FOREIGN PATENT DOCUMENTS

| | | |
|---|---|---|
| EP | 1058320 | 12/2000 |
| EP | 2051124 A2 | 4/2009 |

(Continued)

OTHER PUBLICATIONS

Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.

(Continued)

*Primary Examiner* — Eli S Mekhlin
(74) *Attorney, Agent, or Firm* — Kilpatrick Townsend & Stockton LLP

(57) ABSTRACT

One embodiment can provide a non-flat photovoltaic roof tile. The non-flat photovoltaic roof tile can include a transparent front cover, a back cover, and a plurality of Si-based photovoltaic structures. The transparent front cover can include a first side and a second side, with the first side comprising at least one non-flat portion and the second side comprising a plurality of flat facets. The flat facets are arranged to follow the contour of the at least one non-flat portion. A respective Si-based photovoltaic structure is positioned between a flat facet of the transparent front cover and the back cover.

13 Claims, 18 Drawing Sheets

(56) References Cited

U.S. PATENT DOCUMENTS

| | | |
|---|---|---|
| 6,365,824 B1 | 4/2002 | Nakazima |
| 6,472,594 B1 | 10/2002 | Ichinose |
| 6,586,271 B2 | 7/2003 | Hanoka |
| 6,960,716 B2 | 11/2005 | Matsumi |
| 7,259,321 B2 | 8/2007 | Oswald |
| 7,276,724 B2 | 10/2007 | Sheats |
| 7,506,477 B2 | 3/2009 | Flaherty |
| 7,534,956 B2 | 5/2009 | Kataoka |
| 7,772,484 B2 | 8/2010 | Li |
| 7,833,808 B2 | 11/2010 | Xu |
| 7,851,700 B2 | 12/2010 | Luch |
| 7,858,874 B2 | 12/2010 | Ruskin |
| 7,902,451 B2 | 3/2011 | Shimizu |
| 7,964,440 B2 | 6/2011 | Salleo |
| 8,205,400 B2 | 6/2012 | Allen |
| 8,206,664 B2 | 6/2012 | Lin |
| 8,276,329 B2 | 10/2012 | Lenox |
| 8,471,141 B2 | 6/2013 | Stancel |
| 8,664,030 B2 | 3/2014 | Luch |
| 8,674,377 B2 | 3/2014 | Farquhar |
| 8,701,360 B2 | 4/2014 | Ressler |
| 8,713,861 B2 | 5/2014 | Desloover |
| 8,822,810 B2 | 9/2014 | Luch |
| 9,038,330 B2 | 5/2015 | Bellavia |
| 9,150,966 B2 | 10/2015 | Xu |
| 9,206,520 B2 | 12/2015 | Barr |
| 9,343,592 B2 | 5/2016 | Hunt |
| 9,362,527 B2 | 6/2016 | Takemura |
| 9,412,884 B2 | 8/2016 | Heng |
| 9,525,092 B2 | 12/2016 | Mayer |
| 9,825,582 B2 | 11/2017 | Fernandes |
| 9,899,554 B2 | 2/2018 | Yang |
| 9,966,487 B2 | 5/2018 | Magnusdottir |
| 2001/0054435 A1* | 12/2001 | Nagao ...................... B32B 5/02 136/251 |
| 2002/0015782 A1 | 2/2002 | Abys |
| 2003/0180983 A1 | 9/2003 | Oswald |
| 2004/0261840 A1 | 12/2004 | Schmit |
| 2005/0039788 A1 | 2/2005 | Blieske |
| 2005/0268963 A1 | 12/2005 | Jordan |
| 2006/0086620 A1 | 4/2006 | Chase |
| 2006/0204730 A1 | 9/2006 | Nakamura |
| 2008/0135085 A1* | 6/2008 | Corrales ................. H02S 20/23 136/246 |
| 2009/0120497 A1 | 5/2009 | Schetty |
| 2009/0233083 A1 | 9/2009 | Inoue |
| 2009/0242021 A1 | 10/2009 | Petkie |
| 2009/0308435 A1 | 12/2009 | Caiger |
| 2010/0006147 A1 | 1/2010 | Nakashima |
| 2010/0018568 A1 | 1/2010 | Nakata |
| 2010/0132762 A1 | 6/2010 | Graham |
| 2010/0180929 A1 | 7/2010 | Raymond |
| 2011/0023942 A1 | 2/2011 | Soegding |
| 2011/0030761 A1 | 2/2011 | Kalkanoglu |
| 2011/0277825 A1 | 11/2011 | Fu |
| 2012/0031470 A1 | 2/2012 | Dimov |
| 2012/0048349 A1 | 3/2012 | Metin |
| 2012/0060911 A1 | 3/2012 | Fu |
| 2012/0125391 A1 | 5/2012 | Pinarbasi |
| 2012/0199184 A1 | 8/2012 | Nie |
| 2013/0048062 A1 | 2/2013 | Min |
| 2013/0061913 A1 | 3/2013 | Willham |
| 2013/0160823 A1* | 6/2013 | Khouri ................. H01L 31/048 136/251 |
| 2013/0206213 A1 | 8/2013 | He |
| 2013/0209776 A1 | 8/2013 | Kim |
| 2013/0233378 A1 | 9/2013 | Moslehi |
| 2013/0247959 A1 | 9/2013 | Kwon |
| 2013/0255755 A1 | 10/2013 | Chich |
| 2013/0280521 A1 | 10/2013 | Mori |
| 2014/0120699 A1 | 5/2014 | Hua |
| 2014/0124014 A1* | 5/2014 | Morad ................. H01L 31/042 136/246 |
| 2014/0196768 A1 | 7/2014 | Heng et al. |
| 2014/0313574 A1 | 10/2014 | Bills |
| 2014/0360582 A1 | 12/2014 | Cui |
| 2015/0090314 A1 | 4/2015 | Yang |
| 2015/0155824 A1 | 6/2015 | Chien |
| 2015/0194552 A1 | 7/2015 | Ogasahara |
| 2015/0243931 A1 | 8/2015 | Fukuura |
| 2015/0270410 A1 | 9/2015 | Heng |
| 2015/0349145 A1 | 12/2015 | Morad |
| 2015/0349152 A1 | 12/2015 | Voss |
| 2015/0349703 A1 | 12/2015 | Morad |
| 2016/0013329 A1 | 1/2016 | Brophy |
| 2016/0105144 A1 | 4/2016 | Haynes |
| 2016/0163902 A1 | 6/2016 | Podlowski |
| 2016/0181446 A1 | 6/2016 | Kalkanoglu |
| 2016/0225931 A1 | 8/2016 | Heng |
| 2017/0033250 A1 | 2/2017 | Ballif |
| 2017/0077343 A1 | 3/2017 | Morad |
| 2017/0194516 A1 | 7/2017 | Reddy |
| 2017/0222082 A1 | 8/2017 | Lin |
| 2018/0166601 A1 | 6/2018 | Inaba |

FOREIGN PATENT DOCUMENTS

| | | |
|---|---|---|
| EP | 2709160 | 3/2014 |
| GB | 2278618 | 12/1994 |
| WO | 2009062106 | 5/2009 |
| WO | 2009099418 | 8/2009 |
| WO | 2010128375 | 11/2010 |
| WO | 2011128757 | 10/2011 |
| WO | 201359441 | 4/2013 |
| WO | 2013067541 | 5/2013 |
| WO | 2013102181 | 7/2013 |
| WO | 2014178180 | 11/2014 |
| WO | 2015155356 | 10/2015 |
| WO | 2016090341 | 6/2016 |

OTHER PUBLICATIONS

Bulucani et al., "A new approach: low cost masking material and efficient copper metallization for higher efficiency silicon solar cells" 2015 IEEE.

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016, 2013.

"An inorganic/organic hybrid coating for low cost metal mounted dye-sensitized solar cells"Vyas, N. et al., Abstract #601, 223rd ECS Meeting, 2013 The Electrochemical Society.

"Recovery Act: Organic Coatings as Encapsulants for Low Cost, High Performance PV Modules" Jim Poole et al. Nov. 16, 2011.

* cited by examiner

400

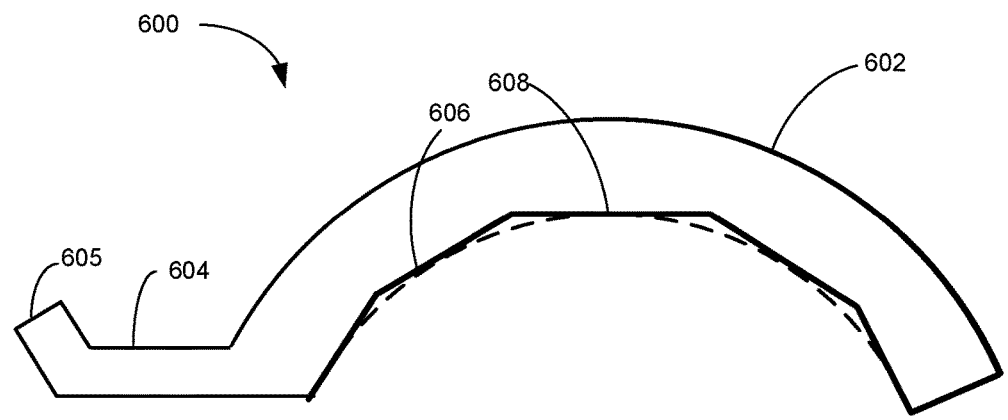
FIG. 6A
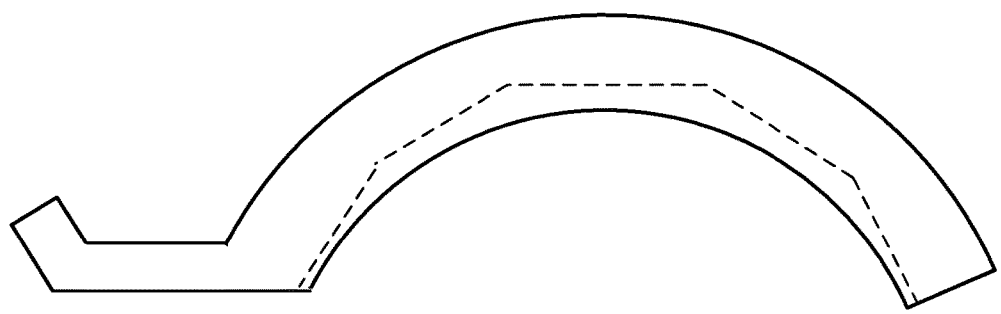
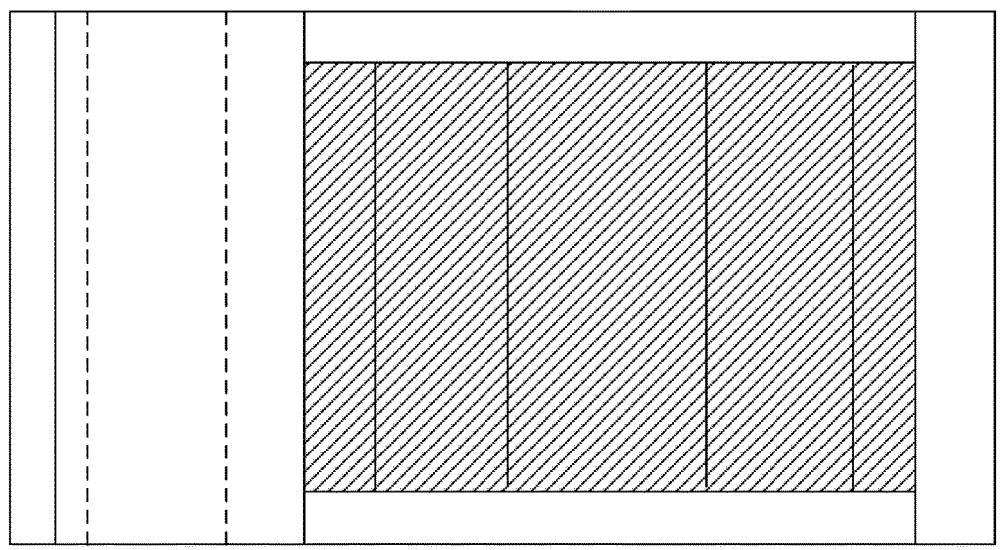
FIG. 6B

NON-FLAT SOLAR ROOF TILES

BACKGROUND

Field

This disclosure is generally related to the design of photovoltaic (or "PV") modules. More specifically, this disclosure is related to the design and manufacture of curved photovoltaic roof tiles.

Related Art

Advances in photovoltaic technology have helped solar energy gain mass appeal among those wishing to reduce their carbon footprint and decrease their monthly energy costs. In residential and commercial solar installations, a building's roof can be covered by photovoltaic (PV) modules, also called PV or solar panels, that can include a two-dimensional array (e.g., 6×12) of solar cells. However, conventional solar panels can leave a portion of the roof uncovered, and can lack aesthetic appeal. A PV roof tile (or solar roof tile) can be a particular type of PV module offering weather protection for the home and a pleasing aesthetic appearance, while also functioning as a PV module to convert solar energy to electricity. A PV roof tile can be shaped like a conventional roof tile and can include one or more solar cells encapsulated between a front cover and a back cover, but typically enclose fewer solar cells than a conventional solar panel.

SUMMARY

One embodiment described herein provides a non-flat photovoltaic roof tile. The non-flat photovoltaic roof tile can include a transparent front cover, a back cover, and a plurality of Si-based photovoltaic structures. The transparent front cover can include a first side and a second side, with the first side comprising at least one non-flat portion and the second side comprising a plurality of flat facets. The flat facets are arranged to follow the contour of the at least one non-flat portion. A respective Si-based photovoltaic structure is positioned between a flat facet of the transparent front cover and the back cover.

In a variation on this embodiment, the transparent front cover can include glass.

In a variation on this embodiment, the back cover can include a photovoltaic backsheet or a rigid back cover comprising a second set of flat facets.

In a variation on this embodiment, adjacent photovoltaic structures positioned on a same flat facet are electrically coupled to each other in series.

In a further variation, the adjacent photovoltaic structures positioned on the same flat facet are coupled in such a way that a first edge busbar positioned on a first photovoltaic structure overlaps a second edge busbar positioned on a second photovoltaic structure.

In a variation on this embodiment, adjacent photovoltaic structures positioned on different flat facets are electrically coupled to each other in parallel.

In a variation on this embodiment, a respective photovoltaic structure can be obtained by dividing a 6-inch by 6-inch square solar cell into three strips.

In a variation on this embodiment, the transparent front cover has a shape similar to that of a conventional roof tile, and the at least one non-flat portion can include a partial-cylindrical surface.

In a variation on this embodiment, the non-flat photovoltaic roof tile can include at least a pair of external electrical connectors for electrical coupling with adjacent roof tiles.

In a variation on this embodiment, the adjacent roof tiles are arranged side by side along a latitudinal axis of the non-flat portion, and the external electrical connectors are configured to couple the adjacent roof tiles in parallel.

In a variation on this embodiment, the adjacent roof tiles are arranged up and down along a longitudinal axis of the non-flat portion, and the external electrical connectors are configured to couple the adjacent roof tiles in series.

In a variation on this embodiment, the flat facets are configured in such a way that they are out of sight when viewed from a side angle.

In a further variation, a respective flat facet can include a flat bottom surface of a pocket formed on the second side of the non-flat photovoltaic roof tile.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

FIG. 6A illustrates an exemplary curved photovoltaic roof tile, according to an embodiment.

FIG. 6B shows the side and bottom views of a curved photovoltaic tile, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the disclosed system solve the problem of providing curved photovoltaic (PV) roof tiles by using a curved transparent enclosure structure with multiple flat facets capable of accommodating flat PV structures. The light-facing (top) side of the enclosure structure can have a curved surface, and the opposite (bottom) side of the enclosure structure can have flat facets for accommodating flat PV structures. The flat facets can follow the contour of the curved surface.

The PV structures can be electrically connected in series or parallel. In particular, parallel electrical connections can aggregate the current produced by multiple PV structures, even if shading and different angles of incident sunlight result in differences among the individual currents.

While PV roof tiles offer solar power generation in an aesthetic and weather-protective design, it is desirable to extend these benefits to a broader variety of roofing materials, including ones with curved surfaces. For example, due to aesthetic preferences or climate, consumers may prefer terracotta-barrel tiles or other curved roof tiles. In addition to the curved tile, architectural features such as spires or the roofing surface may be curved (e.g., domed or conical roofs). Designing solar tiles with curved surfaces can be challenging. One possible solution is to design PV cells that are curved or flexible. However, such approaches would require elaborate changes in device structure, materials, and interconnection.

Figure 1:
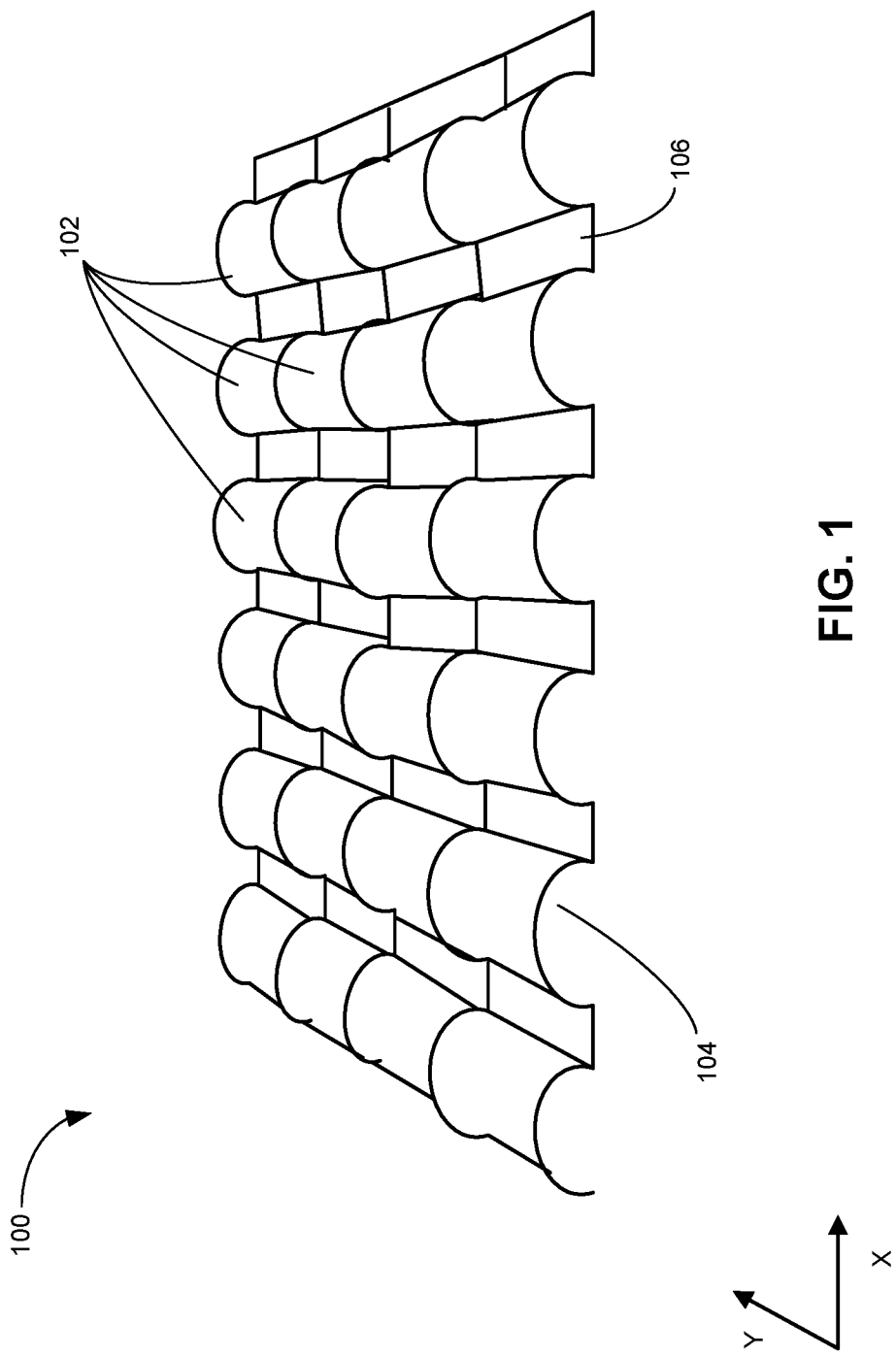
FIG. 1 illustrates an exemplary terracotta-barrel roof.

FIG. 1 illustrates an exemplary roof with terracotta-barrel tiles. A typical terracotta-barrel roof is covered by curved roof tiles 102, which can include a curved portion 104 and an optional flat portion 106. In some cases, the tile may include only the curved portion without a flat portion. In the example shown in FIG. 1, the curved portion of a tile can have a substantially cylindrical shape, with a longitudinal axis Y pointing toward a ridge or pinnacle of the roof. Other curved shapes are also possible.

Adjacent roof tiles can be arranged so that their curved portions align along the Y-direction. The flat portion of a tile can contact the curved portion of an adjacent tile along a latitudinal X-direction, which may correspond to the axis of the roof's ridge or another surface of constant height along the roof. In some cases, the roof may be flat or level, or may slope along both axes, as in a hip or tented roof. Other shapes and configurations of curved roofs (such as domed or conical roofs) and/or curved roof tiles are possible.

The disclosed system and methods can fit multiple PV structures onto a curved PV roof tile such as roof tile 102, thereby allowing a curved roof or a roof with curved tiles to produce solar power. The disclosed curved enclosure structure's flat facets can approximate a curved surface, such as curved portion 104, while accommodating flat PV structures. The curved enclosure structure may include a top portion and a bottom portion that can be fastened together to enclose the PV structures. Alternatively, the enclosure structure can include a single top portion and a backsheet, which can jointly enclose the PV structures. In some embodiments, PV structures within a curved PV roof tile can be coupled in parallel to aggregate their output currents, which can differ from each other due to different incident angles of sunlight on the curved surface. At the same time, the tiles can be coupled in parallel in each row along the X-direction, and rows can be coupled in series in the Y-direction. In this way, the disclosed system can optimize the amount of solar power produced.

PV Modules and Roof Tiles

The disclosed system and methods may be used to form PV modules or rooftop tiles with curved surfaces. In general, a PV module (or panel) can include one or more solar cells encapsulated between a top glass cover and a backsheet or back glass cover. A PV roof tile (or solar roof tile) is a type of PV module shaped like a roof tile and typically enclosing fewer solar cells than a conventional solar panel. Note that such PV roof tiles can function as both PV modules and roof tiles at the same time. PV roof tiles and modules are described in more detail in U.S. Provisional Patent Application No. 62/465,694, entitled "SYSTEM AND METHOD FOR PACKAGING PHOTOVOLTAIC ROOF TILES," filed Mar. 1, 2017, which is incorporated herein by reference. In some embodiments, the system disclosed herein can be applied to PV roof tiles and/or PV modules.

Figure 2:
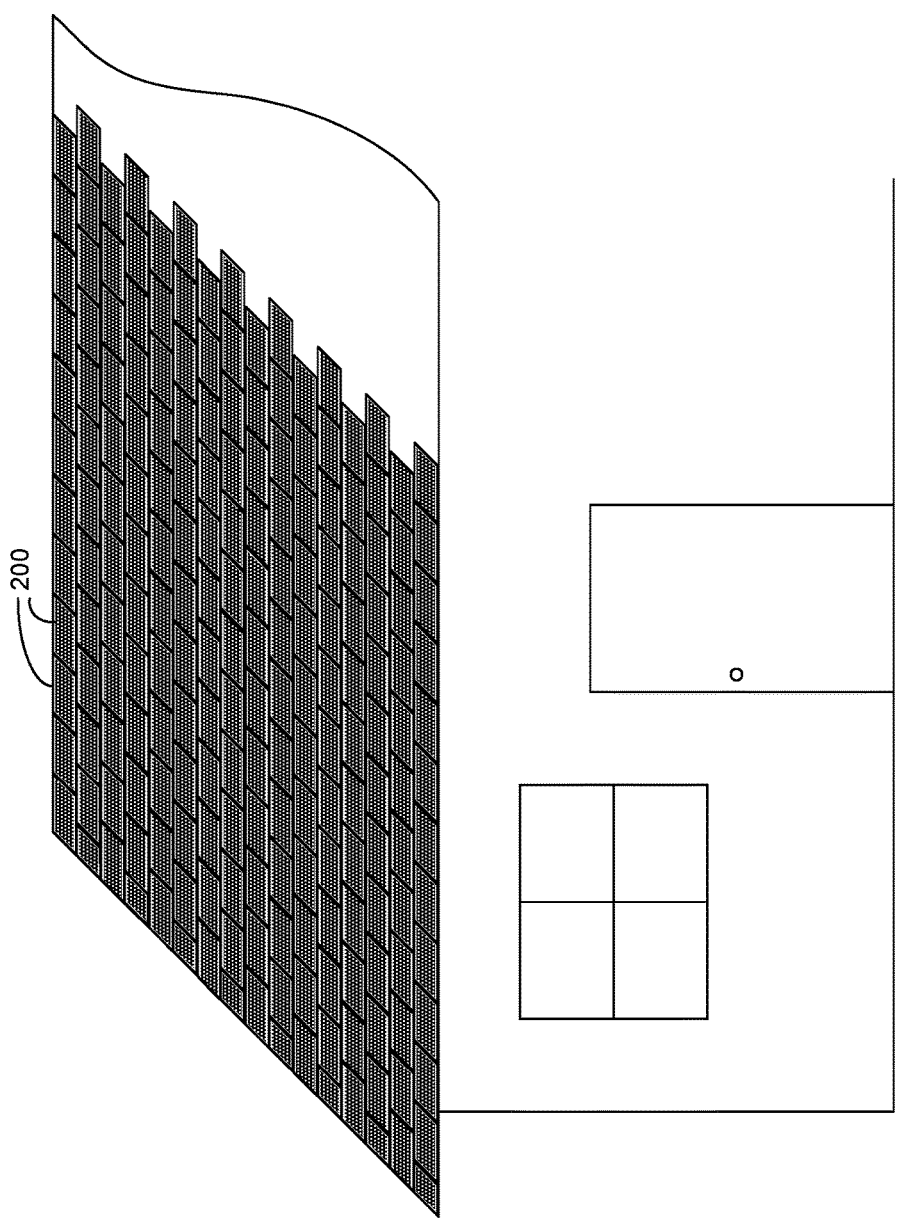
FIG. 2 shows an exemplary configuration of photovoltaic roof tiles on a house.

FIG. 2 shows an exemplary configuration of photovoltaic roof tiles on a house. PV roof tiles 200 can be installed on a house like conventional roof tiles or shingles. Particularly, a PV roof tile can be placed with other tiles in such a way as to prevent water from entering the building.

A respective PV structure (also referred to as "PV cell" or "solar cell") in a PV roof tile can include one or more electrodes such as busbars and finger lines, and can connect mechanically and electrically to other cells. The finger lines can collect carriers from the cell, while the busbars can aggregate current from several finger lines. Separate PV cells within a tile can be electrically coupled by a tab, via their respective busbars, to create in-series or parallel connections. For example, a tabbing strip can substantially cover a respective busbar (which aggregates current from the finger lines) on the front side of a PV cell, and couple the PV cell to the back side of an adjacent PV cell. Moreover, electrical connections can be made between adjacent tiles, so that a number of PV roof tiles can jointly provide electrical power.

Figure 3:
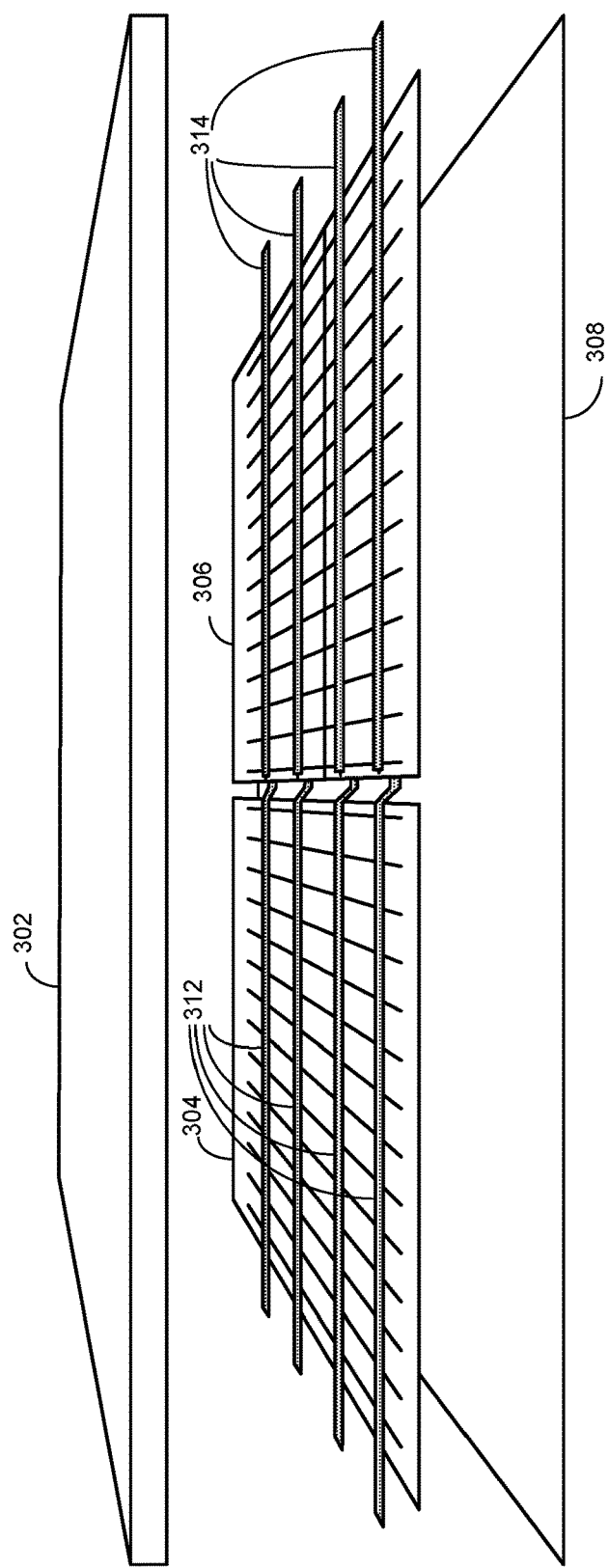
FIG. 3 shows a perspective view of the configuration of a photovoltaic roof tile.

FIG. 3 shows a perspective view of the configuration of a photovoltaic roof tile. In this view, PV cells 304 and 306 can be hermetically sealed between top glass cover 302 and backsheet 308, which jointly can protect the PV cells from the weather elements. Tabbing strips 312 can be in contact with front-side busbar electrodes of PV cell 304 (e.g., by covering the busbars) and extend beyond the left edge of glass 302, thereby serving as contact electrodes of a first polarity of the PV roof tile. Tabbing strips 312 can also be in contact with the back side of PV cell 306, creating an in-series connection between PV cell 304 and PV cell 306. Tabbing strips 314 can be in contact with front-side busbar electrodes of PV cell 306 and extend beyond the right-side edge of glass cover 302. Using long tabbing strips covering a substantial portion of a front-side electrode can ensure sufficient electrical contact, reducing the likelihood of detachment.

Figure 4:
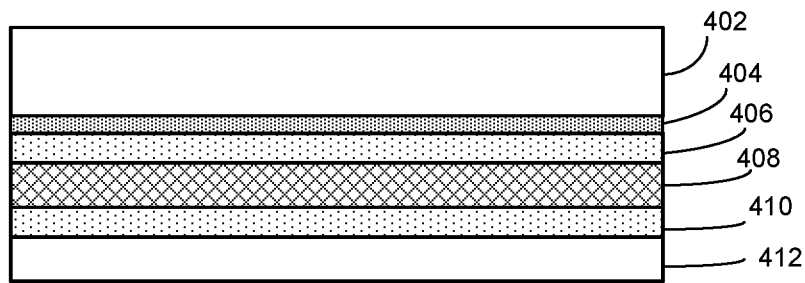
FIG. 4 shows a cross-section of an exemplary photovoltaic module or roof tile.

FIG. 4 shows a cross-section of an exemplary photovoltaic module or roof tile 400. In this example, PV cell or array of PV cells 408 can be encapsulated by top glass cover 402 and backsheet 412. Note that backsheet 402 can be substituted with a back glass cover. Top encapsulant layer 406, which can be based on a polymer, can be used as a seal between top glass cover 402 and PV cell or array of PV cells 408. Specifically, encapsulant layer 406 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 410, which can be based on a similar material, can be used as a seal between array of PV cells 408 and backsheet 412.

A PV roof tile or module can also contain other optional layers, such as an optical filter or coating layer or a layer of nanoparticles to provide a desired color appearance. In the example of FIG. 4, module or roof tile 400 also contains an optical filter layer 404. In some embodiments, such optional layers can be used in curved PV roof tiles, e.g., an optical filter or nanoparticle layer providing red or terracotta hue to enhance the appearance of a terracotta-barrel PV roof tile.

Figure 5:
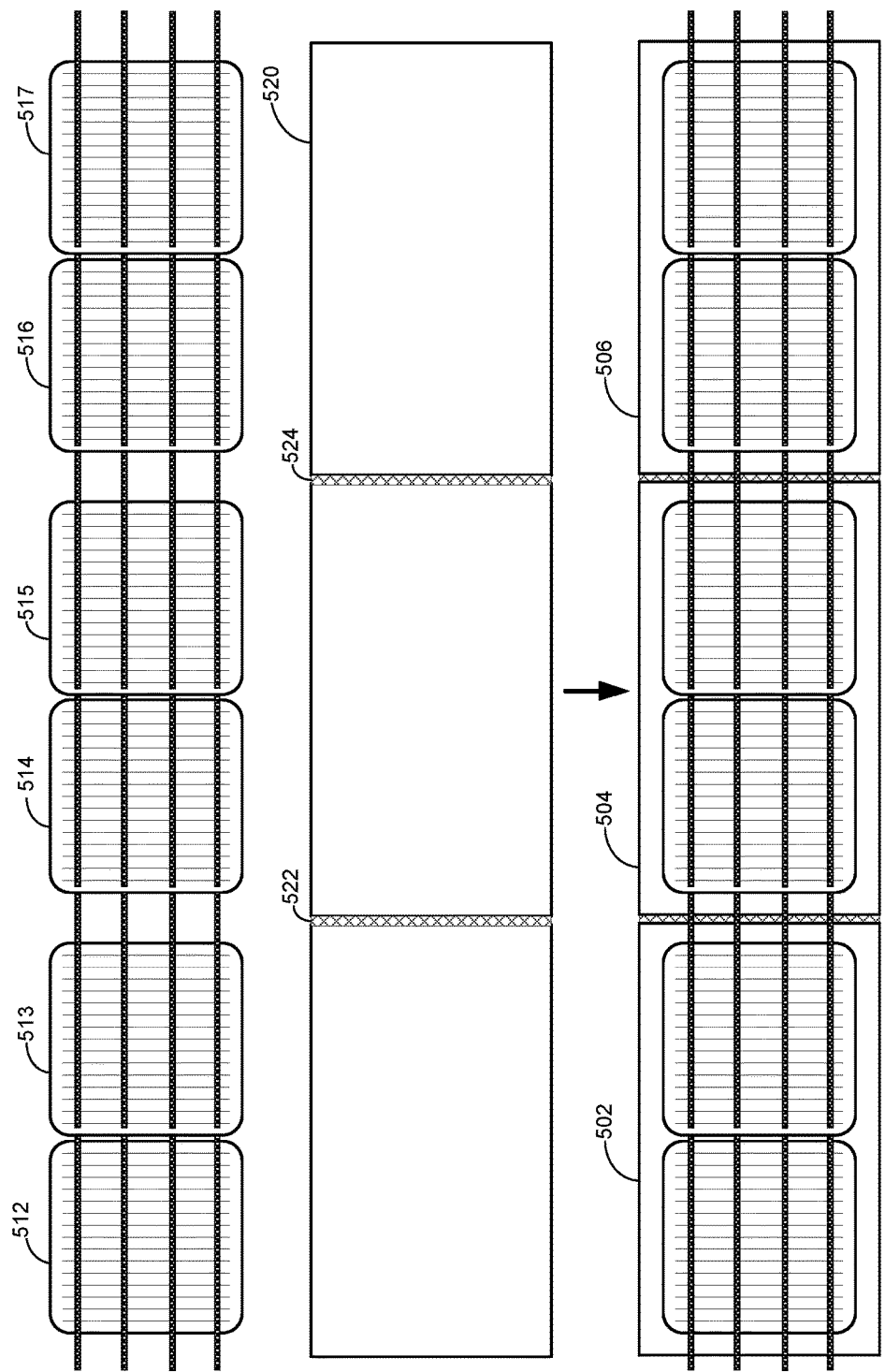
FIG. 5 illustrates an exemplary configuration of a multi-unit group of photovoltaic roof tiles.

To facilitate more scalable production and easier installation, a number of photovoltaic roof tiles can be fabricated together, while the tiles are linked in a rigid or semi-rigid way. FIG. 5 illustrates an exemplary configuration of a multi-unit group of photovoltaic roof tiles. In this example, three PV roof tiles 502, 504, and 506 can be manufactured together. Note that other numbers of tiles are also possible. While a PV roof tile can be a specific type of PV module, in some embodiments, a PV module can contain one or more PV rooftop tiles, and thus can itself be a multi-unit group. This manufacturing method can be applied to disclosed curved roof tiles. In the example shown in FIG. 5, PV cells 512 and 513 (corresponding to tile 502), 514 and 515 (corresponding to tile 504), and 516 and 517 (corresponding to tile 506) can be laid out with tabbing strips interconnecting their corresponding busbars, forming a connection in series.

A PV rooftop tile can contain multiple (e.g., two) PV cells. To reduce internal resistance of the entire solar roof installation and to improve fill factor, a single PV cell can be divided into multiple strips, which can be electrically coupled in series.

Structure and Design of Curved Roof Tiles

In certain climates or regions, consumers sometimes prefer curved PV roof tiles. FIG. 6A illustrates an exemplary curved photovoltaic roof tile, according to an embodiment. In this example, curved PV roof tile 600 can include a curved portion 602, a flat portion 604, and an underlap portion 605. Underlap portion 605 allows PV roof tile 600 to interlock with an adjacent tile. In various embodiments, either or both of curved portion 602 and flat portion 604 can accommodate PV structures. In the example shown in FIG. 6A, curved portion 602 can contain a top curved surface and a number of flat facets (e.g., flat facets 606 and 608) on the bottom surface, which can accommodate flat PV structures such as PV cell strips. More specifically, Si-based photovoltaic structures can be sealed between the flat facets and a backsheet. These flat facets, including facets 606 and 608 can conform to the curvature of curved portion 602 (as shown by the dashed line). In some embodiments, a curved roof tile may include only the curved portion (e.g., the barrel) without a flat portion.

Figure 6C:
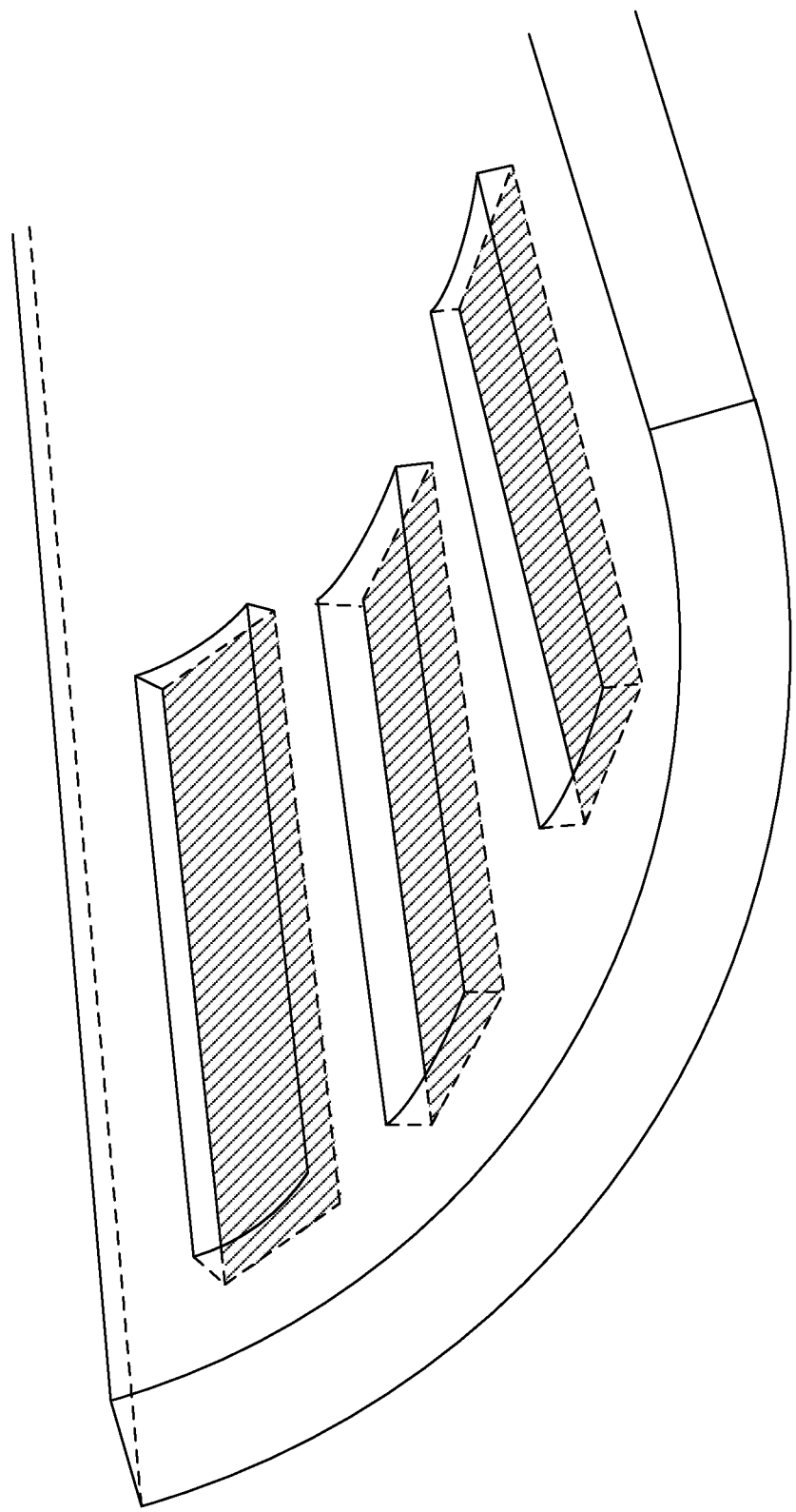
FIG. 6C shows the partial view of the barrel of a curved photovoltaic tile, according to one embodiment.

In one embodiment, curved portion 602 can be significantly thick to conceal the underlying flat facets. In addition, the edges of curved portion 602 can extend beyond the edges of the flat facets to conceal the edges of the flat facets (as shown in FIG. 6B), thus giving the appearance of a smooth curve of the tile when viewed from the side. FIG. 6B shows the side and bottom views of a curved photovoltaic tile, according to one embodiment. More specifically, the top drawing of FIG. 6B shows the side view of the curved PV roof tile, and the bottom drawing of FIG. 6B shows the bottom view of the curved PV roof tile. The cross-hatched region indicates the location of the flat facets. As one can see from FIG. 6B, the flat facets are invisible when viewed from the side. In other words, when viewed from the street this curved PV roof tile appears to be similar to a conventional barrel tile. In addition to using flat facets on its bottom surface to accommodate PV structures, in some embodiments, a number of pockets can be formed on the bottom surface of the barrel, as shown in FIG. 6C. FIG. 6C shows the partial view of the barrel of a curved photovoltaic tile, according to one embodiment. The cross-hatched regions in FIG. 6C indicate the flat bottom of each pocket. The PV structures can then fit into these pockets in the appropriate positions. In these configurations, a backsheet can then be used to seal the PV roof tile. Similar to the example shown in FIG. 6B, the flat facets in FIG. 6C are out of sight when viewed from the side.

Returning to FIG. 6A, curved portion 602 and/or flat portion 604 is transparent, and may be made from glass, acrylic, or another transparent material. Curved portion 602 can have a curved cross-sectional profile along the tile's latitudinal axis (which can correspond to the X-axis of FIG. 1) and can have a flat cross-section along the tile's longitudinal axis (corresponding to the Y-axis of FIG. 1). In some embodiments, the top curved surface of the cross-sectional profile along the latitudinal axis can include a circular arc, a semi-circle, or other curved shape, and is not limited by the examples disclosed herein.

In one embodiment, the curved PV roof tile can contain additional elements to enhance its aesthetic appeal, such as improving its resemblance to an actual terracotta-barrel tile. For example, as illustrated by FIG. 4, a conventional PV roof tile or module can contain an optical filter or a layer of nanoparticles 404 to provide a desired color. Such optional layers can be used in curved PV roof tiles. For example, an optical filter or nanoparticle layer providing red or terracotta hue can be included in a curved solar roof, which can enhance the appearance of a terracotta-barrel PV roof tile.

Figure 6D:
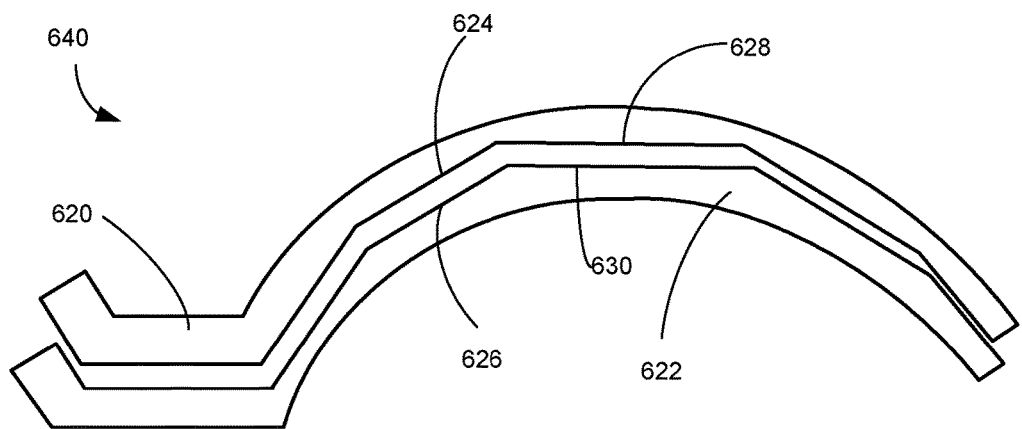
FIG. 6D illustrates an exemplary curved photovoltaic roof tile, according to an embodiment.

In the example shown in FIG. 6A, curved portion 602 of curved roof tile 600 contains a single piece with a curved exterior surface and an interior surface with a number of flat facets, upon which photovoltaic structures can be placed. Alternatively, a curved roof tile can include a top component and a bottom component, which jointly enclose the PV structures. FIG. 6D illustrates an exemplary curved photovoltaic roof tile, according to an embodiment. In FIG. 6D, curved PV roof tile 640 can include curved top component 620 and curved bottom component 622, each having a curved surface. Moreover, curved top and bottom components 620 and 622 can contain matching pairs of flat facets, such as facets 624 and 626 and facets 628 and 630, which face each other. In one embodiment, curvatures of the top and bottom components 620 and 622 can be similar or symmetrical to each other. These two components can be attached to form a curved enclosure structure. The corresponding top and bottom flat facets, such as facets 624 and 626, can form flat regions for accommodating flat PV structures. Meanwhile, the PV roof tile can have curved top and bottom surfaces, which are the top surface of top component 620 and bottom surface of bottom component 622, respectively.

Figure 6E:
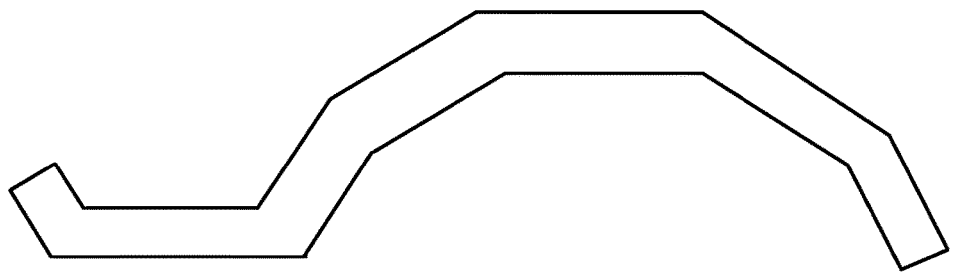
FIG. 6E illustrates an exemplary photovoltaic roof tile, according to an embodiment.

In one more embodiment, the top surface of the enclosure may not be curved. Instead, the top surface can include multiple flat facets in a way similar to the bottom surface of roof tile 600. In other words, the continuous curved surface of the roof tile can be replaced with multiple flat facets that follow the contour of the curve. FIG. 6E illustrates an exemplary photovoltaic roof tile, according to an embodiment.

Figure 6F:
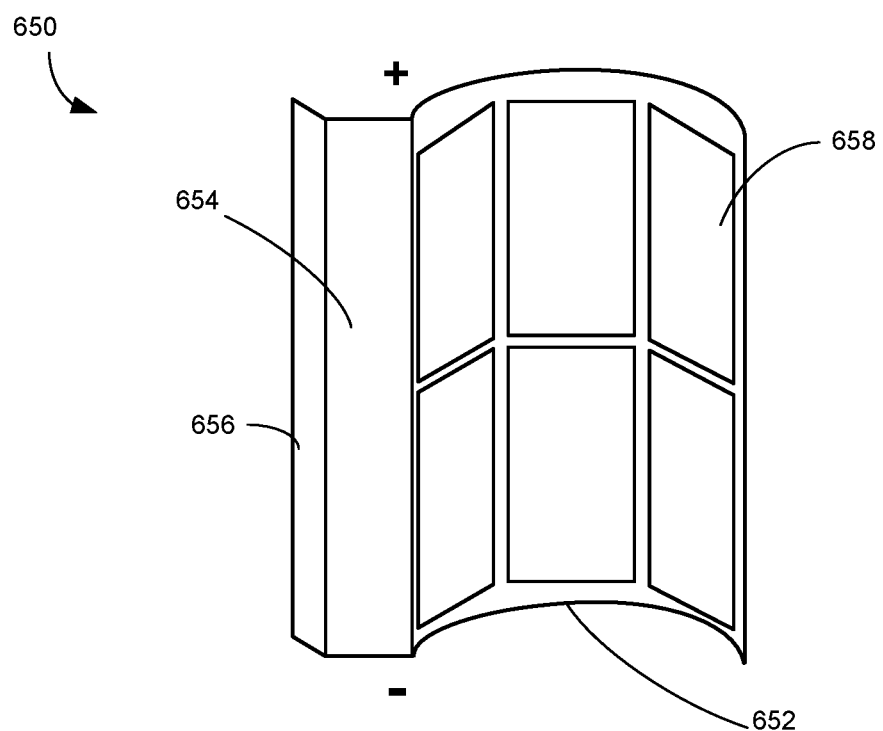
FIG. 6F illustrates a perspective view of a curved photovoltaic roof tile, according to an embodiment.

FIG. 6F illustrates a perspective view of a curved photovoltaic roof tile, according to an embodiment. For simplicity of illustration, the curved photovoltaic roof tile is shown as transparent to allow the underlying structure to be seen. In this example, curved roof tile 650 includes curved barrel 652, flat portion 654, and underlap portion 656, which underlaps the curved portion of an adjacent roof tile. Curved barrel 652 contains multiple flat facets, with each flat facet accommodating one or more photovoltaic structures, such as photovoltaic structure 658. These photovoltaic structures can be coupled electrically to collectively output power. Moreover, curved roof tile 650 can include positive and negative electrical terminals (not shown in the drawing) for coupling to adjacent PV roof tiles.

Figure 7A:
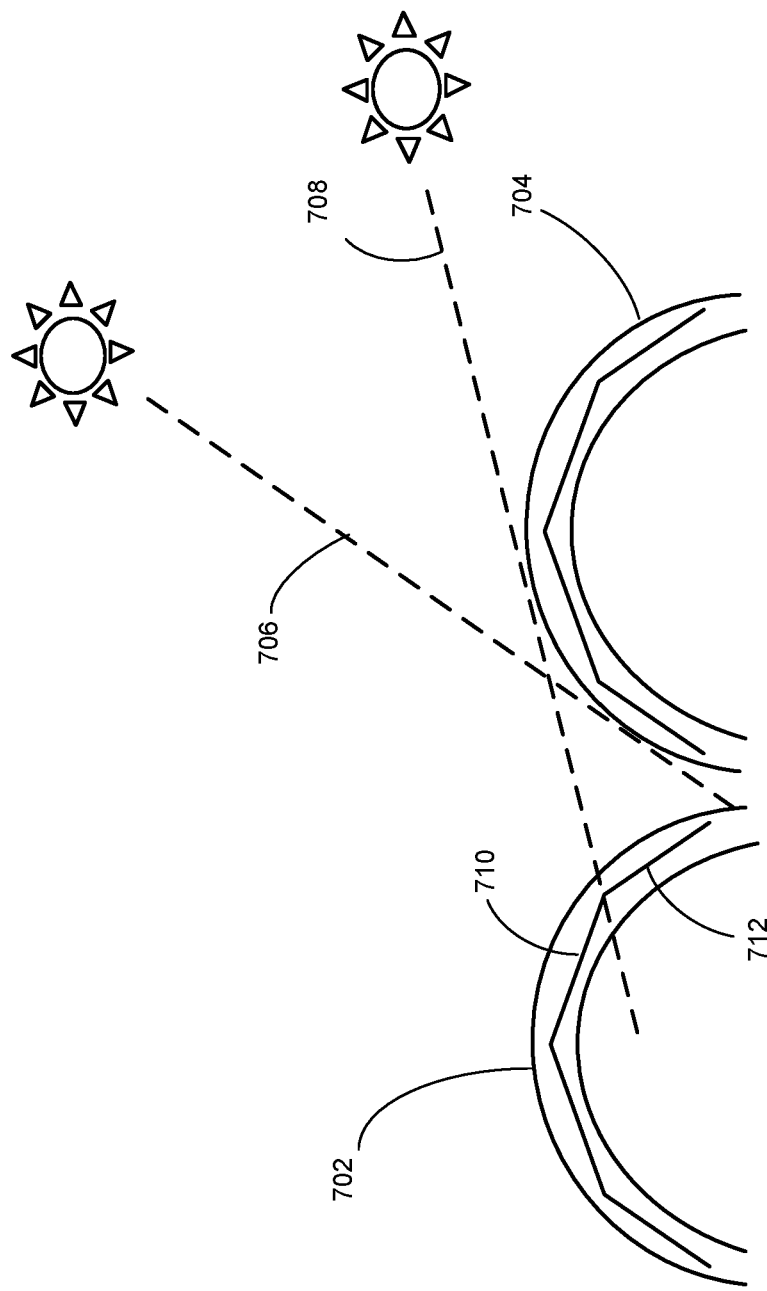
FIG. 7A illustrates self-shading in a curved photovoltaic roof tile.

Unlike conventional photovoltaic modules where the enclosed photovoltaic structures are arranged in a coplanar manner, the curved PV roof tiles require special design consideration. More specifically, because the photovoltaic structures enclosed in a curved PV roof tile are not located on the same plane, they may receive different amounts of sunlight. For example, one side of the barrel may receive more or less sunlight than the other side of the barrel. Moreover, the non-flat nature of the barrel can also lead to self-shading. For example, depending on the position of the sun, one side of the barrel may shade the other side, or the curved barrel of one tile may shade a portion of another tile. FIG. 7A illustrates self-shading in a curved photovoltaic roof tile. In this example, depending on the position of the sun, curved PV tile 702 may be more or less shaded by the curved barrel of adjacent roof tile 704, and vice versa.

For example, at a certain time of day, the sunlight can follow a path such as that of steeply angled ray 706, and can illuminate most of the surfaces of both curved PV tiles 702 and 704, as shown in FIG. 7A. In particular, both facets 710 and 712 can be illuminated by steeply angled ray 706. However, at a different time, the sunlight may follow a path such as that of shallow-angled ray 708, which is tangential to the top surface of adjacent roof tile 704. As a result, the bottom portion of roof tile 702 (e.g., facet 712) can be shaded by adjacent tile 704. In addition to direct sunlight, indirect sunlight (e.g., reflective or refractive sunlight) can also contribute to the generation of solar power. Because indirect sunlight often has a shallow incidence angle, it is more likely to be affected by the self-shading effect.

To solve this problem, in some embodiments, PV structures may only be placed on an upper portion of the curved barrel. For example, in FIG. 6A, flat facet 606 can be the lowest facet that accommodates PV structures. In some embodiments, it is also possible to configure the PV roof tile such that only the upper portion of its barrel includes flat facets, whereas the lower portion of the barrel remains curved. Placing PV structures over the upper half of the curved barrel can provide solar power while avoiding shading between roof tiles. In some embodiments, the curved barrel of a PV roof tile can have a shape similar to the outer shell of a half cylinder, and the facets and/or PV structures can be located on the upper half portion (e.g., occupying a 90° circular arc when viewed from the side) on the curved barrel.

In addition to shading, the angle of incidence of sunlight can also affect the amount of sunlight absorbed, and hence, the amount of power generated, by PV structures located on different parts of the barrel. FIG. 7B illustrates a situation where sunlight is incident vertically on a flat photovoltaic roof tile. In this example, direct sunlight is incident substantially vertically on a flat PV roof tile containing PV structures 720, 722, and 724. Because none of these structures is shaded by any other, and all receive sunlight at substantially the same angle, each one of PV structures 720, 722, and 724 can output roughly the same current and voltage (e.g., 3 A of current and 0.7 V of voltage). Note that, even when sunlight is incident from a shallower angle, PV structures 720, 722, and 724 can still be exposed to sunlight from approximately equal angles, and can each output the same current and voltage (e.g., 2 A of current and 0.7 V of voltage).

In contrast, for a curved PV roof tile, the angle of incidence of sunlight can vary significantly among the different PV structures. FIG. 7C illustrates a situation where sunlight is incident vertically on a curved photovoltaic roof tile. For simplicity of illustration, FIG. 7C only shows the photovoltaic structures enclosed within the curved barrel. In FIG. 7C, the curved barrel can include PV structures 740, 742, and 744. As one can see, even if the sun is directly overhead, because structures 740 and 744 are angled, they receive less sunlight than structure 742. For example, structure 742 can output 3 A of current, whereas structures 740 and 744 can each output only 2 A of current.

When the sunlight is incident at a shallow angle, the variation of output among the PV structures can be larger.

Figure 7D:
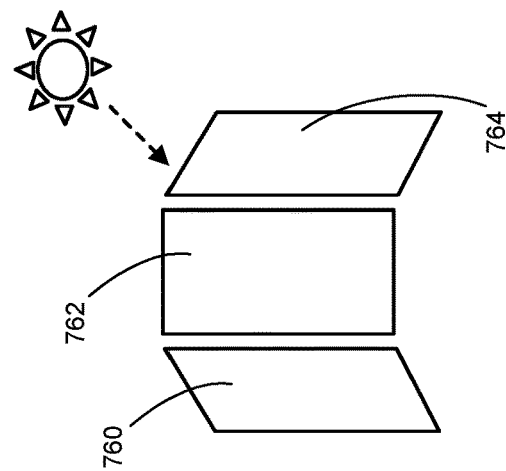
FIG. 7D illustrates a situation where sunlight is incident on a curved photovoltaic roof tile at a shallow angle.
Figure 7C:
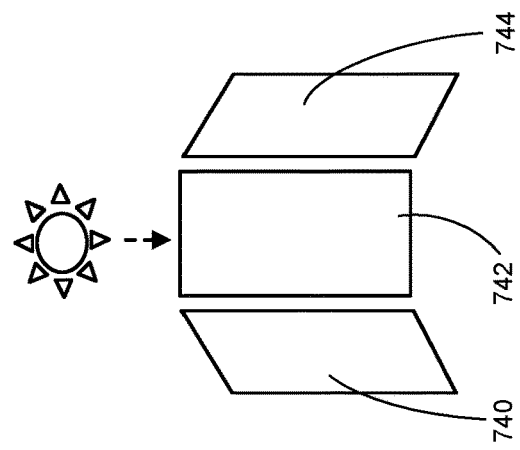
FIG. 7C illustrates a situation where sunlight is incident vertically on a curved photovoltaic roof tile.
Figure 7B:
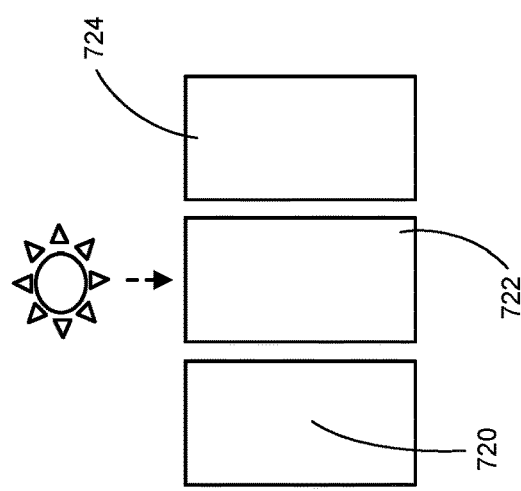
FIG. 7B illustrates a situation where sunlight is incident vertically on a flat photovoltaic roof tile.

FIG. 7D illustrates a situation where sunlight is incident on a curved photovoltaic roof tile at a shallow angle. In FIG. 7D, the curved barrel can include PV structures 760, 762, and 764. Because the incident sunlight is from the right side of the curved barrel, leftmost PV structure 760 receives the least amount of sunlight, middle structure 762 receives an intermediate amount, and rightmost structure 764 can receive the most sunlight. As a result, structure 764 can output 3 A of current, whereas structure 762 can output 2 A and structure 760 can output only 1 A of current. Thus, in this example, leftmost PV structure 760 could produce just one-third as much current as rightmost structure 764.

Given these large discrepancies among PV structures' output currents, coupling the structures in series, as is conventionally done when forming a photovoltaic module or panel, can be problematic. In particular, since each structure can operate as an independent current source, the series coupling of the PV structures can be limited to the lowest current output from any of the structures in the string, thus significantly reducing the power output of the photovoltaic module. In the example shown in FIG. 7D, if structures 760, 762, and 764 were connected in series, the output current could be limited to 1 A. To increase the power output, it is desirable to couple photovoltaic structures receiving different amounts of sunlight in parallel.

Figure 7E:
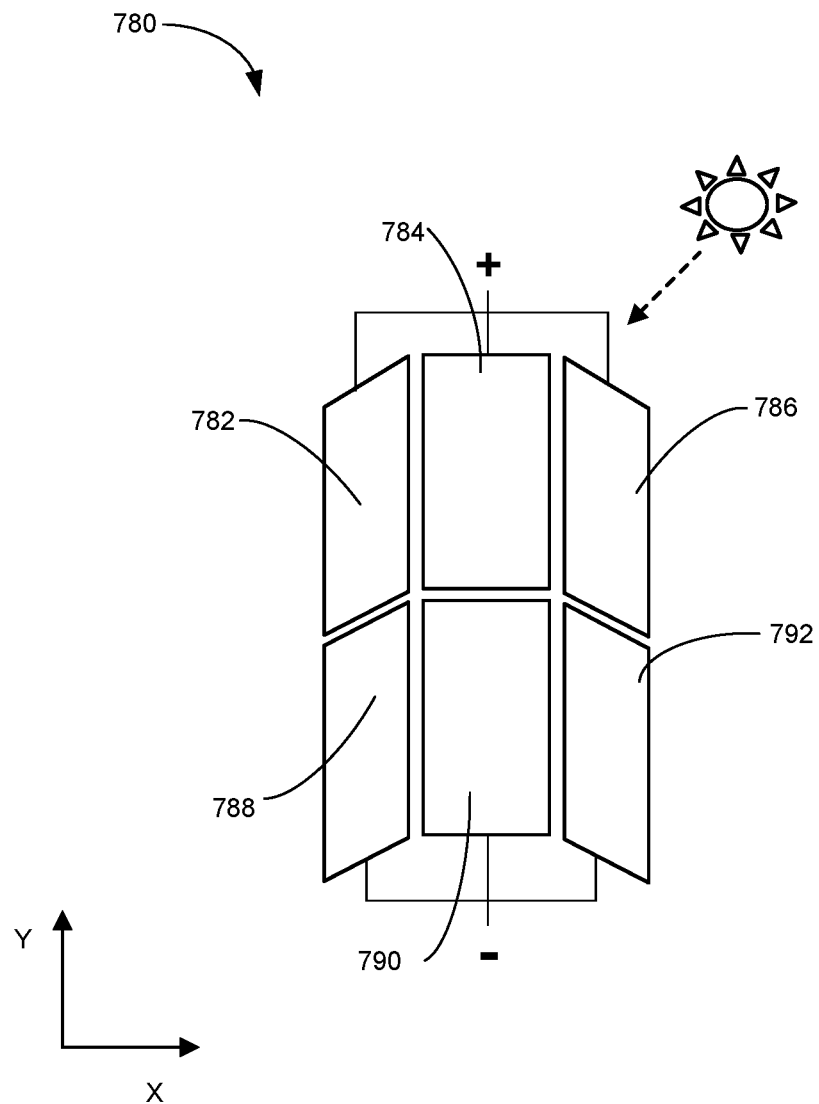
FIG. 7E illustrates exemplary electrical coupling among photovoltaic structures in curved photovoltaic roof tiles, according to an embodiment.

FIG. 7E illustrates exemplary electrical coupling among photovoltaic structures in curved photovoltaic roof tiles, according to an embodiment. In FIG. 7E, PV module 780 can include a number of PV structures. PV structures 782, 784, and 786 are arranged on flat facets along a curved latitudinal X-axis of a roof tile (which is not shown for simplicity of illustration). PV structures 788, 790, and 792 can also be arranged along the X-axis, and can be adjacent along the longitudinal Y-axis to structures 782, 784, and 786, respectively. In one embodiment, structures 782, 784, and 786 can belong to a first roof tile and structures 788, 790, and 792 can belong to a second roof tile. In an alternative embodiment, all these photovoltaic structures can be enclosed within a single roof tile.

Because photovoltaic structures along the X-axis can output different currents as described above, they need to be electrically coupled in parallel. On the other hand, photovoltaic structures aligned to the same Y-direction (or on the same flat facet) can output substantially similar currents; hence, they can be electrically coupled in series. In the example shown in FIG. 7E, the pair of structures 782 and 788 can be coupled in series with each other, as can the pair of structures 784 and 790 and the pair of structures 786 and 792. At the same time, each of these pairs can be coupled in parallel to the others. The total output current of PV module 780 can be the sum of the output currents of the three pairs of PV structures. Similarly, the total output voltage of PV module 780 can be the sum of output voltages of the two PV structures in each pair.

The number of PV structures that are electrically coupled together to form a module can be more or less than what is shown in FIG. 7E. In general, parallel connections among PV structures can be made along the roof in the X-direction, and serial connections can be made up and down the roof in the Y-direction. In addition, a number of tiles can be grouped together to form a module, and the modules can then be electrically coupled together to generate a power output.

Electrical Connections of Curved Roof Tiles

As described above, the PV structures can be electrically coupled both within and between curved roof tiles. For example, PV structures with a same roof tile can be electrically coupled together, and adjacent curved roof tiles can be also be coupled together. In some embodiments, electrical coupling between PV structures with a same roof tile can be achieved via bussing wires or by edge overlapping, and electrical coupling between adjacent curved roof tiles can be achieved via specially designed electrical connectors.

Figure 8A:
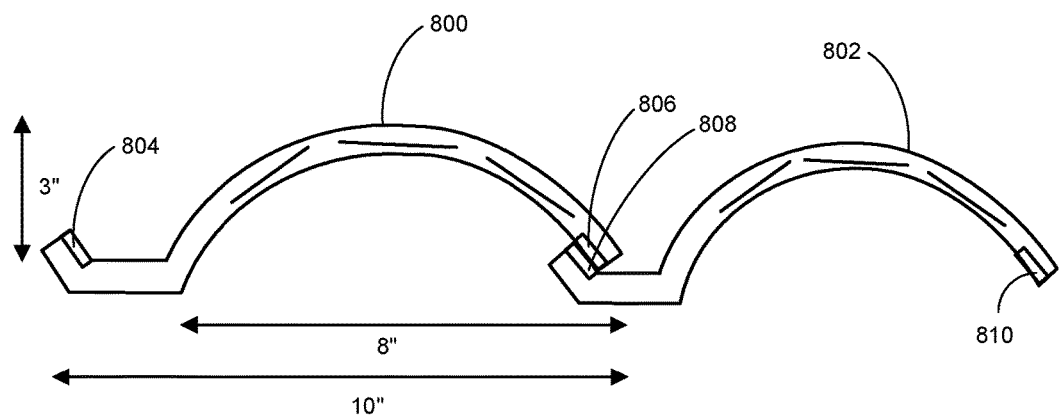
FIG. 8A illustrates side-by-side interlocking of adjacent curved photovoltaic roof tiles, according to an embodiment.

For PV roof tiles that are adjacent to each other along the latitudinal X-direction, a parallel connection can be made. FIG. 8A illustrates side-by-side interlocking of adjacent curved photovoltaic roof tiles, according to an embodiment. Photovoltaic roof tiles 800 and 802 can be placed next to each other, along the X-direction, in order to cover the roof as shown in FIG. 1. More specifically, the underlap portion of roof tile 802 can be designed to underlap the curved barrel of roof tile 800. Each roof tile can have two electrical connectors, one for each polarity. In some embodiments, one connector can be located on the top surface of the underlap, whereas the other connector can be located on the bottom surface of the curved barrel. For example, roof tile 800 can have electrical connectors 804 and 806, and roof tile 802 can have electrical connectors 808 and 810. These electrical connectors are electrically connected to photovoltaic structures enclosed in the roof tile. The interlocking between the two adjacent roof tiles can result in direct contact or electrical coupling between the corresponding electrical connectors. In FIG. 8A, connector 806 on the bottom surface of the curved barrel of tile 800 can make electrical contact with connector 808 on the underlap portion of adjacent roof tile 802. To facilitate a parallel connection, connectors 806 and 808 have the same polarity. In some embodiments, depending on the shape of the tiles, the configuration of the electrical connectors may be different. For example, in some embodiments, the roof tile may include only a curved barrel with no flat portion, and therefore electrical contact can be made between connectors on the top and bottom surfaces of barrels of the adjacent tiles.

FIG. 8A also demonstrates exemplary dimensions of the roof tiles. More specifically, the width of the entire roof tile can be about 10 inches, and the width of the barrel can be about 8 inches. Moreover, the height of the barrel can be about 3 inches. The size and shape of the PV roof tiles can change depending on the design need.

Figure 8B:
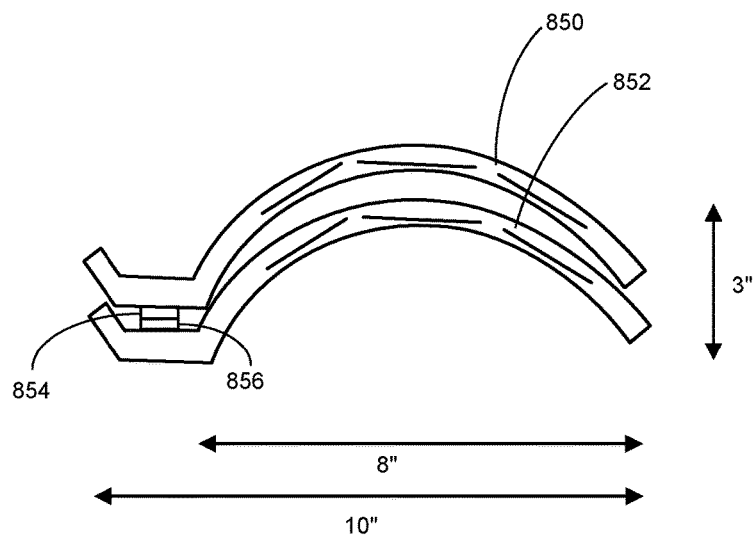
FIG. 8B illustrates the partial overlapping of adjacent curved photovoltaic roof tiles in the Y-direction, according to an embodiment.
Figure 8C:
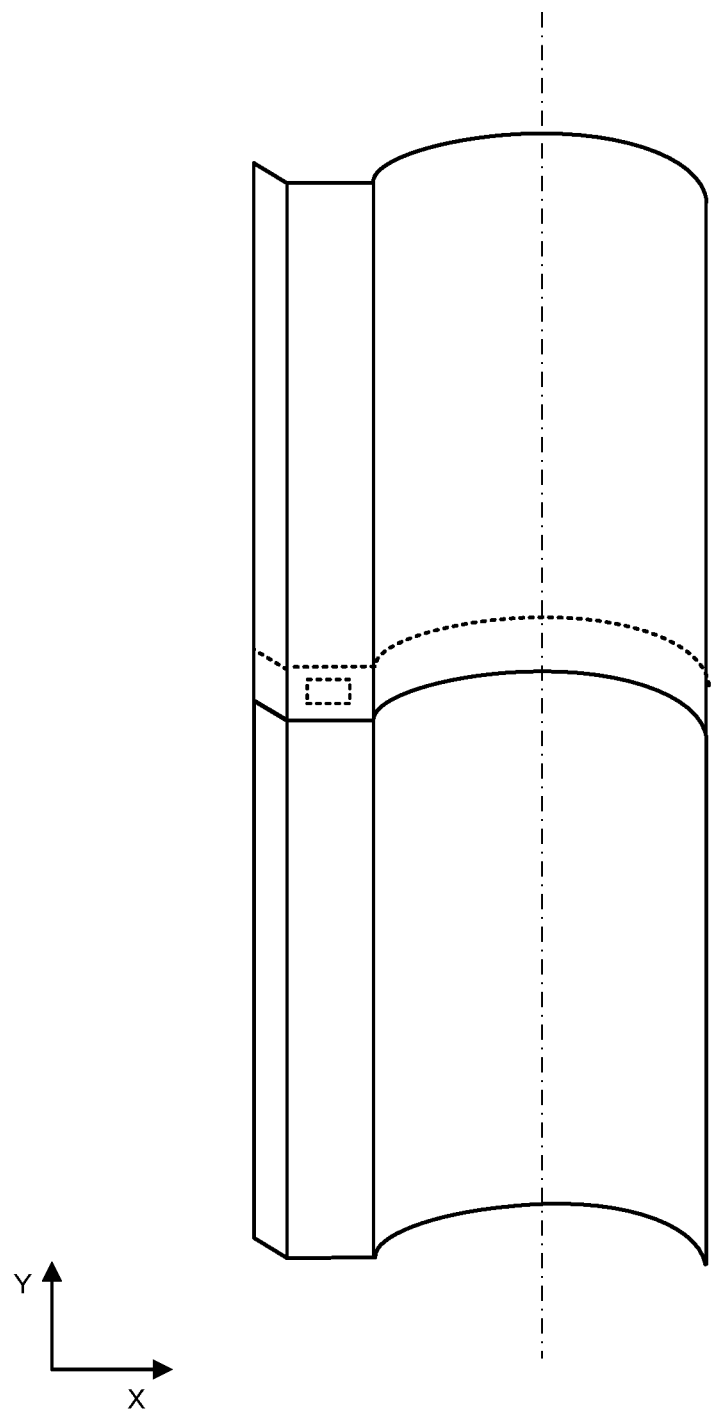
FIG. 8C illustrates a top view of curved photovoltaic roof tiles partially overlapped along the Y-direction, according to an embodiment.

Serial connections can be made up and down the roof in the Y-direction, which is along the longitudinal axis of the partial-cylindrical barrel. FIG. 8B illustrates the partial overlapping of adjacent curved photovoltaic roof tiles in the Y-direction, according to an embodiment. In FIG. 8B, roof tiles 850 and 852 can be placed next to each other along the Y-direction. In one embodiment, the adjacent tiles can overlap at the edge along the Y-direction. In one embodiment, the flat portion of a roof tile can include a pair of electrical connectors, one on the top surface near an edge and one on the bottom surface near the opposite edge. This way, when the two adjacent tiles edge-overlap along the Y-direction, the corresponding electrical connectors can make contact or be coupled to each other electrically. In the example shown in FIG. 8B, electrical connector 854 on the bottom surface of roof tile 850 is in contact or overlaps electrical connector 856 on the top surface of roof tile 852, thereby electrically coupling roof tiles 850 and 852 along the Y-direction. To facilitate a serial connection, connectors 854 and 856 have opposite polarities. FIG. 8C illustrates a top view of curved photovoltaic roof tiles partially overlapped along the Y-direction, according to an embodiment. As one can see from FIG. 8C, in this scenario, the longitudinal axes of barrels of these two adjacent roof tiles align with each other, as shown by the dashed line.

In the examples shown in FIGS. 8A-8B, after laying the tiles, the electrical connectors can be concealed by the PV roof tiles, resulting in the PV roof tiles having an appearance similar to that of conventional roof tiles.

Depending on the design, curved tiles on a roof can be connected in parallel (as shown in FIG. 8A), in series (as shown in FIG. 8B), or in a way that mixes the two types of connections. For example, to electrically couple tiles on one side of the roof, one may choose to first connect tiles in each row in parallel and then connect the rows of tiles in series. Alternatively, one may choose to connect tiles in each column in series and then connect the columns of tiles in parallel.

To reduce internal resistance and/or increase output voltage, in some embodiments, a photovoltaic structure can be achieved by dividing a standard square PV cell into multiple strips. A laser-based scribing-and-cleaving operation can be applied to divide a regular (i.e., square) PV cell into smaller rectangular strips, which are typically a fraction, such as one-third, of the length of the original cell. To reduce solar shading and to increase the packing factor, the strips can be connected serially in a shingled pattern. In this disclosure, a "photovoltaic structure" can refer to a PV cell, or a PV cell segment or strip.

Figure 9A:
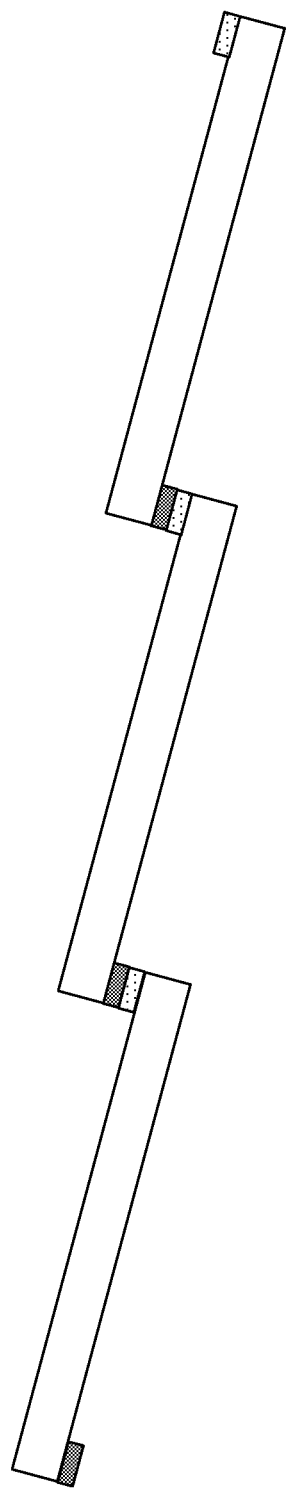
FIG. 9A illustrates a side view of a string of cascaded strips.

FIG. 9A illustrates a side view of a string of cascaded strips. In this example, the strips can be segments of a six-inch square or pseudo-square PV cell, with each strip having a dimension of approximately two inches by six inches. To minimize shading, the overlapping between adjacent strips should be kept as small as possible. Therefore, in this example, the single busbars (both at the top and the bottom surfaces) are placed at the very edge of the strip. Electrical connections in PV structures, roof tiles, and modules are described in U.S. patent application Ser. No. 14/563,867, entitled "HIGH EFFICIENCY SOLAR PANEL," filed Dec. 8, 2014, and in U.S. patent application Ser. No. 15/656,794, entitled "PACKAGING FOR SOLAR ROOF TILES," filed Jul. 21, 2017, the disclosures of which are incorporated herein by reference.

Figure 9B:
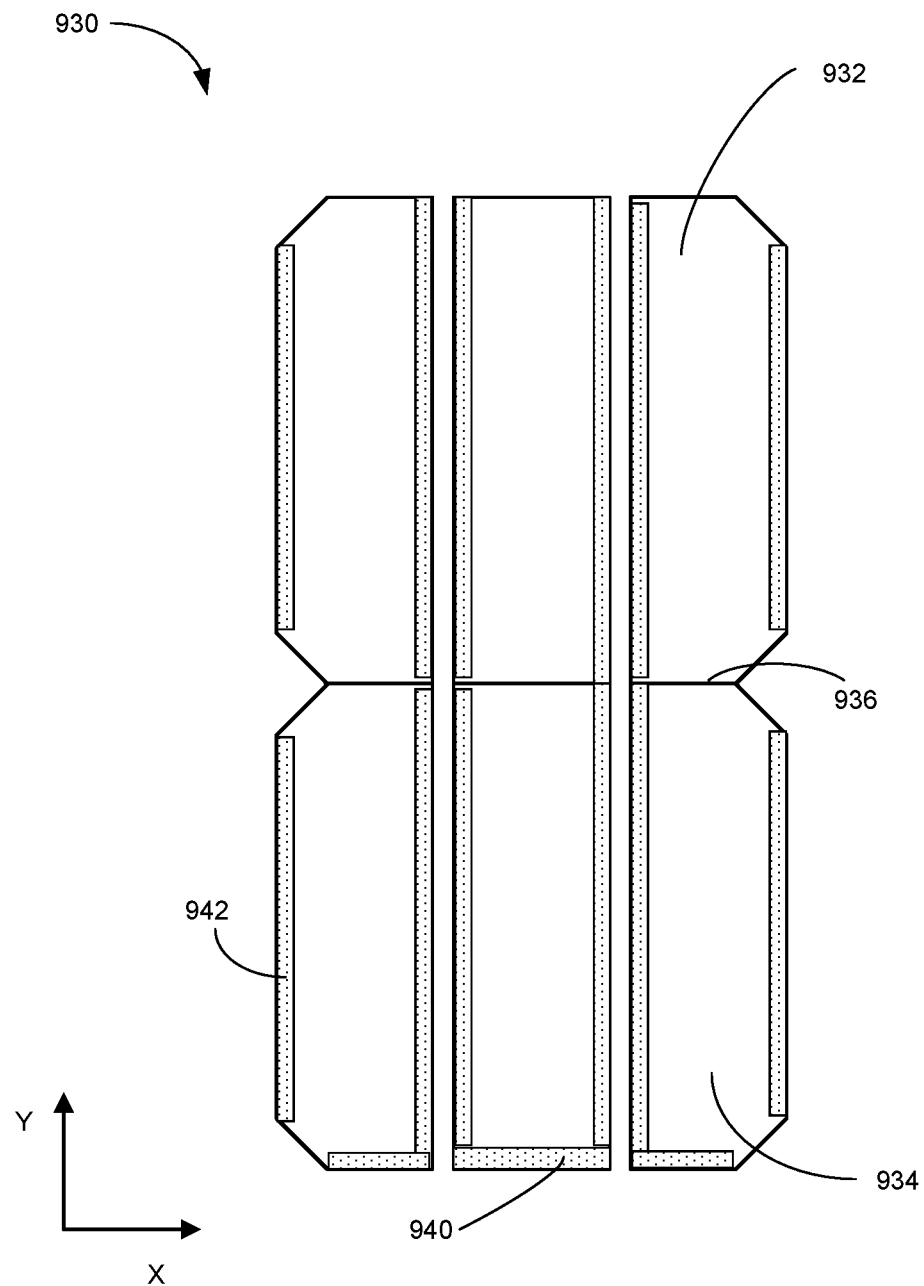
FIG. 9B illustrates cascaded strips in curved photovoltaic roof tiles, according to an embodiment.

For a curved roof tile that can accommodate multiple photovoltaic structures on each flat facet, cascading can used for achieving electrical coupling. FIG. 9B illustrates cascaded strips in a curved photovoltaic roof tile, according to an embodiment. As one can imagine, it can be difficult to cascade PV structures positioned on different facets along the latitudinal X-axis. However, cell strips positioned on the same flat facet (e.g., strips 932 and 934) can be shingled in the longitudinal Y-direction. To facilitate shingling, busbars (e.g., busbar 940) can be formed along the shorter edges of the strip. In FIG. 9B, strip 934 can overlap strip 932 in the cascaded fashion described above, making electrical contact via busbars along their overlapped edge 936. In addition to the busbar at the shorter edges, in some embodiments, busbars can also be formed on the longer edges (e.g., edge busbar 942) of the PV structures to facilitate current flow lengthwise, while the finger lines (not shown in the drawing) run parallel to the short edges.

Figure 9C:
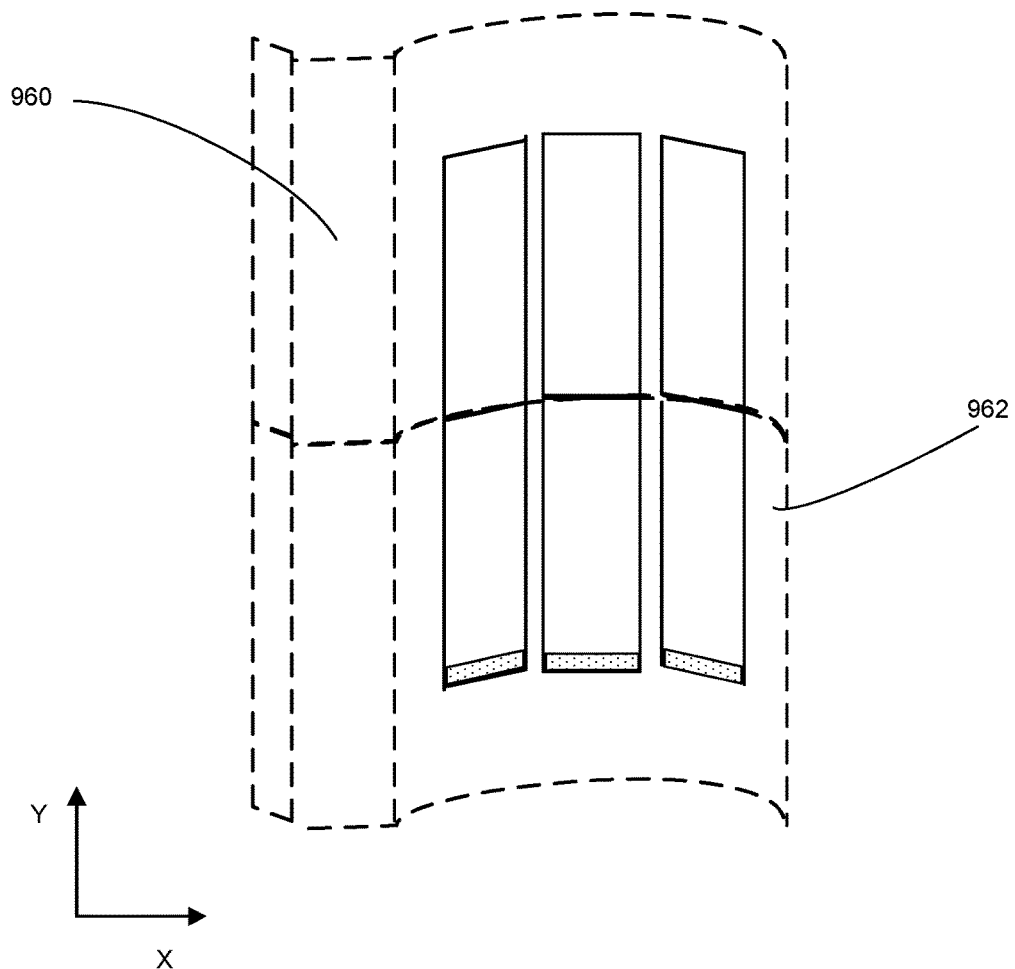
FIG. 9C illustrates cascaded strips in adjacent curved photovoltaic roof tiles, according to an embodiment.

In an embodiment, the cascading of strips can extend across different curved photovoltaic roof tiles along the longitudinal Y-direction. FIG. 9C illustrates cascaded strips in adjacent curved photovoltaic roof tiles, according to an embodiment. In this example, PV strips belonging to curved PV roof tile 960 and PV strips belonging to adjacent curved PV roof tile 962 may overlap at the shorter edge, similar to the example shown in FIG. 9B. More specifically, the overlapping portions of the strips can be at the interface between the two adjacent tiles. In one embodiment, the adjacent PV roof tiles can be nested or cascaded in the Y-direction, similar to the example shown in FIGS. 8B and 8C. Note that a regular backsheet can be applied at the back side of the tiles to seal PV structures within the tiles.

In some embodiments, it may not be preferable to cascade PV structures in a curved roof tile. In this case, the PV structures can be interconnected by tabbing strips or other types of electrical connecting mechanism. In some embodiments, undivided square PV cells can be placed on the facets instead of strips.

Additional Design Considerations

A number of variations on the embodiments described above can be possible, e.g., with respect to electrical interconnections, structure, and design. In some embodiments, each roof tile can be considered as a PV module with a pair of power-output electrodes, and multiple curved roof tiles can be coupled together in series, so that the total output voltage sums over the multiple tiles.

It is also possible to form multi-unit groups of curved roof tiles, similar to the multi-unit groups of conventional PV roof tiles illustrated in FIG. 5. For example, a respective multi-unit group can include three curved roof tiles coupled in series or in parallel. Alternatively, the multi-unit group can include any other number of curved roof tiles. In one embodiment, the curved roof tiles are not grouped. While a PV roof tile can be a specific type of PV module, in some embodiments, a PV module can contain one or more curved PV roof tiles, and thus can itself be a multi-unit group.

As described above, some curved roof tiles can be electrically coupled in series, e.g., along a longitudinal Y-direction. In various embodiments, series connections can be made with metal tabs, ribbons, or other connecting mechanisms. In one embodiment, a plurality of curved PV roof tiles interconnected in series can be referred to as a series string, and several such series strings can be interconnected in parallel. In various embodiments, the size and configuration of such series strings can differ. For example, series strings can be configured to output higher voltages by interconnecting additional roof tiles per string, or can be configured to output higher current by interconnecting additional strings in parallel. Additional configurations are possible, and are not limited by the present disclosure.

Regarding the structure and design of the curved roof tiles, variations are possible in the shape, curvature, and size of the curved barrel. In one embodiment, the curvature and thickness of the curved roof tile can be configured to avoid refractive or lensing effects that could potentially impair the functioning and/or reliability of the enclosed PV structures (e.g., focusing or defocusing of sunlight). Such variations in design can apply to curved tiles either with or without the flat portion. The structural design variations can be interrelated with the design of electrical connections. For example, the layout of PV structures within each curved tile can affect the design of electrical interconnections within the roof tile, as well as the electrical interconnections among multiple roof tiles. Likewise, the grouping of roof tiles into modules, and the number of tiles per group, can be interrelated with the design of electrical connections within and between modules.

Fabricating a Curved Photovoltaic Roof Tile

Figure 10:
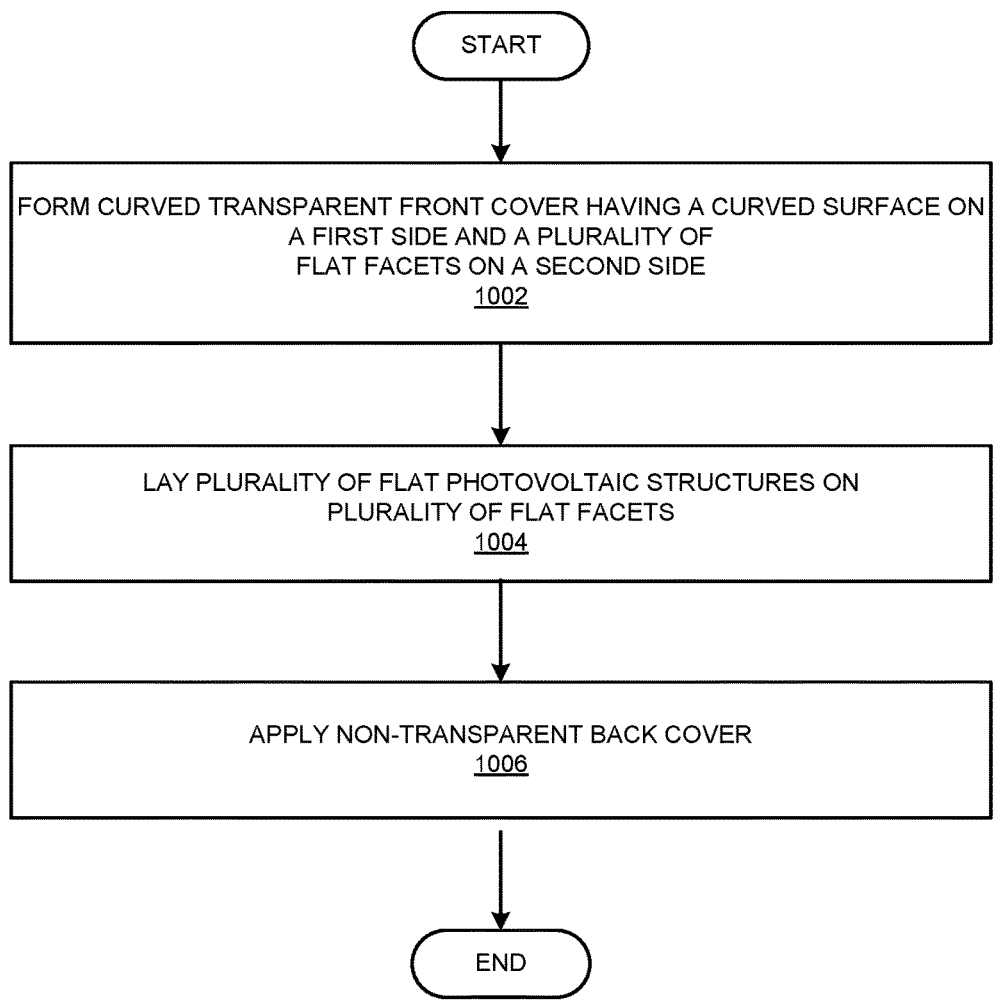
FIG. 10 shows a flowchart illustrating an exemplary process for fabricating a curved photovoltaic roof tile, according to an embodiment.

FIG. 10 shows a flowchart illustrating an exemplary process for fabricating a curved photovoltaic roof tile, according to an embodiment. During fabrication, a transparent front cover can be formed with a curved or non-flat surface on a first side and a plurality of flat facets on a second side (operation 1002). The shape of the transparent front cover can be similar to that of a conventional roof tile, such as a barrel tile. In some embodiments, the transparent front cover can comprise glass. The first side can be the sun-facing side of the roof tile. The curved transparent front cover can be defined by two axes that are substantially in the plane of the roof. These two axes can correspond to the latitudinal X-axis and longitudinal Y-axis, respectively. The cross-section of the curved transparent front cover along a first axis (e.g., the latitudinal X-axis) can include at least a curved portion and an optional flat portion. The flat portion can further be configured to interlock with a second roof tile.

A plurality of flat photovoltaic structures can then be laid on the plurality of flat facets (operation 1004). A respective PV structure can include a PV cell or a PV cell strip. In some embodiments, each PV structure can be obtained by dividing a conventional 6-inch square PV cell into three strips. In an embodiment, adjacent PV structures arranged along the latitudinal X-axis are electrically coupled in parallel, and adjacent PV structures along the longitudinal Y-axis can be electrically coupled in series. In other words, adjacent PV structures on different flat facets can be coupled in parallel, whereas adjacent PV structures on the same flat facet can be coupled in series. If the curved transparent front cover includes a flat portion, one or more PV structures can also be laid on the flat portion. In one embodiment, the adjacent PV structures coupled in series along the second axis can be overlapped in a cascaded pattern.

Subsequently, a non-transparent back cover can be applied (operation 1006). Applying the back cover can involve a lamination process. In some embodiments, the non-transparent back cover can include a regular PV backsheet (e.g., polyvinyl fluoride (PVF) or polyethylene terephthalate (PET) films) and encapsulant can also be applied to ensure that the photovoltaic structures are securely sealed between the front and back covers, thus preventing the photovoltaic structures from being exposed to the environmental factors. The backsheet is relatively flexible and can follow the curvature of the back side of the transparent front cover. To reduce moisture ingress, in some embodiments, the backsheet can include a metal interlayer, such as an Al interlayer.

In one embodiment, the back cover can include a rigid curved cover having a second plurality of flat facets. The flat facets on the back cover can correspond to flat facets on the transparent front cover. Hence, applying the back cover can result in the photovoltaic structures being sandwiched between the flat facets on the front cover and the flat facets on the back cover. Encapsulant can also be applied, facilitating encapsulation of the photovoltaic structures between the front and back covers.

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A non-flat photovoltaic roof tile, comprising:
a transparent front cover having a first surface and a second surface, wherein the first surface comprises at least one portion that is convexly curved, wherein the second surface comprises a plurality of flat facets, and wherein the flat facets are arranged to follow the contour of the at least one convexly curved portion of the first surface;
a back cover; and
a plurality of Si-based photovoltaic structures, wherein a respective Si-based photovoltaic structure is positioned between a flat facet of the transparent front cover and the back cover.

2. The non-flat photovoltaic roof tile of claim 1, wherein the transparent front cover comprises glass.

3. The non-flat photovoltaic roof tile of claim 1, wherein the back cover comprises:
a backsheet; or
a rigid back cover comprising a second set of flat facets.

4. The non-flat photovoltaic roof tile of claim 1, wherein adjacent photovoltaic structures positioned on a same flat facet are electrically coupled to each other in series.

5. The non-flat photovoltaic roof tile of claim 4, wherein the adjacent photovoltaic structures positioned on the same flat facet are coupled in such a way that a first edge busbar positioned on a first photovoltaic structure overlaps a second edge busbar positioned on a second photovoltaic structure.

6. The non-flat photovoltaic roof tile of claim 1, wherein adjacent photovoltaic structures positioned on different flat facets are electrically coupled to each other in parallel.

7. The non-flat photovoltaic roof tile of claim 1, wherein a respective photovoltaic structure comprises a strip that is ⅓ of a 6-inch by 6-inch square solar cell.

8. The non-flat photovoltaic roof tile of claim 1, wherein the transparent front cover has a shape similar to that of a conventional roof tile, and wherein the at least one convexly curved portion comprises a partial-cylindrical surface.

9. The non-flat photovoltaic roof tile of claim 1, further comprising at least a pair of external electrical connectors for electrical coupling with adjacent roof tiles.

10. The non-flat photovoltaic roof tile of claim 9, wherein the adjacent roof tiles are arranged side by side along a latitudinal axis of the convexly curved portion, and where the external electrical connectors are configured to couple the adjacent roof tiles in parallel.

11. The non-flat photovoltaic roof tile of claim 9, wherein the adjacent roof tiles are arranged up and down along a longitudinal axis of the convexly curved portion, and where the external electrical connectors are configured to couple the adjacent roof tiles in series.

12. The non-flat photovoltaic roof tile of claim 1, wherein the at least one convexly curved portion and the flat facets are arranged in such a way that an edge of the at least one convexly curved portion extends beyond an edge of the flat facets to conceal the flat facets from a side view.

13. The non-flat photovoltaic roof tile of claim 12, wherein a respective flat facet includes a flat bottom surface of a pocket formed on the second surface of the non-flat photovoltaic roof tile.

* * * * *